(12) United States Patent
Patel et al.

(10) Patent No.: US 7,071,545 B1
(45) Date of Patent: Jul. 4, 2006

(54) SHIELDED INTEGRATED CIRCUIT PACKAGE

(75) Inventors: Viresh Patel, Austin, TX (US); Mohan Kirloskar, Cupertino, CA (US)

(73) Assignee: ASAT Ltd., Hong Kong (HK)

( * ) Notice: Subject to any disclaimer, the term of this patent is extended or adjusted under 35 U.S.C. 154(b) by 137 days.

(21) Appl. No.: 10/323,658

(22) Filed: Dec. 20, 2002

(51) Int. Cl.
*H01L 23/02* (2006.01)

(52) U.S. Cl. ..................................... 257/686; 257/777
(58) Field of Classification Search ........ 257/777–778, 257/787, 686, 666
See application file for complete search history.

(56) References Cited

U.S. PATENT DOCUMENTS

| | | | |
|---|---|---|---|
| 4,677,458 A | 6/1987 | Morris | |
| 5,557,142 A | 9/1996 | Gilmore et al. | 257/659 |
| 5,637,916 A | 6/1997 | Joshi | 257/668 |
| 5,644,167 A * | 7/1997 | Weiler et al. | 257/777 |
| 5,650,659 A | 7/1997 | Mostafazadeh et al. | 257/660 |
| 5,679,975 A | 10/1997 | Wyland et al. | 257/659 |
| 6,072,122 A | 6/2000 | Hosoya | 174/52.4 |
| 6,222,265 B1 | 4/2001 | Akram et al. | 257/723 |
| 6,229,200 B1 | 5/2001 | Mclellan et al. | 257/666 |
| 6,281,581 B1 | 8/2001 | Desai et al. | 257/737 |
| 6,303,981 B1 | 10/2001 | Moden | |
| 6,377,464 B1 | 4/2002 | Hashemi et al. | 361/760 |
| 6,410,981 B1 | 6/2002 | Tao | 257/704 |
| 6,414,383 B1 | 7/2002 | Stout | 257/682 |
| 6,545,365 B1 | 4/2003 | Kondo et al. | 257/777 |
| 6,569,712 B1 | 5/2003 | Ho et al. | 438/121 |
| 6,593,647 B1 | 7/2003 | Ishikawa | 257/686 |
| 6,593,662 B1 | 7/2003 | Pu et al. | 257/777 |
| 6,744,121 B1 * | 6/2004 | Chang et al. | 257/668 |
| 6,744,126 B1 | 6/2004 | Chiang | |
| 6,818,978 B1 * | 11/2004 | Fan | 257/686 |
| 2004/0063246 A1 | 4/2004 | Karnezos | |

* cited by examiner

*Primary Examiner*—Hoai Pham
(74) *Attorney, Agent, or Firm*—Mayer Brown Rowe & Maw LLP

(57) ABSTRACT

An integrated circuit package is provided. The package includes a die attach pad having a first side and a second side. A first semiconductor die is mounted to the first side of the die attach pad, a plurality of contact pads disposed in close proximity to the first semiconductor die. A first plurality of wire bonds connect the first semiconductor die and ones of the contact pads. An overmold encapsulates the first plurality of wire bonds and the first semiconductor die, the die attach pad and the contact pads being embedded in the overmold. A plurality of leads are disposed proximal the second side of the die attach pad. A second semiconductor die is mounted to one of the second side of the die attach pad and ones of the plurality of leads such that the ones of the plurality of leads are electrically connected to the second semiconductor die. The second semiconductor die and the leads are embedded in an encapsulant. The die attach pad shields the second semiconductor die.

7 Claims, 9 Drawing Sheets

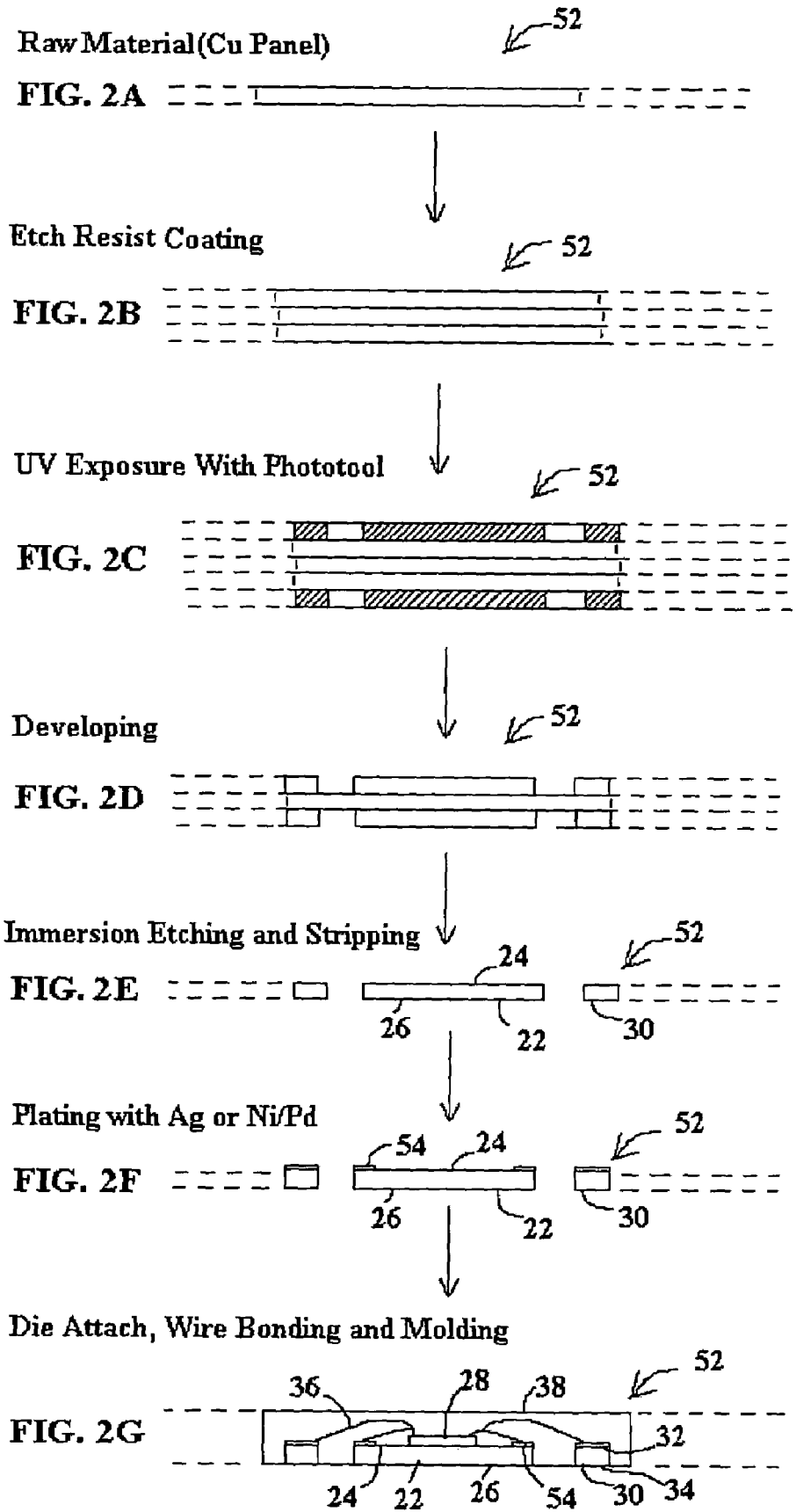

Etch Resist Coating

UV Exposure With Phototool

Developing

Immersion Etching and Stripping

Plating with Ag or Ni/Pd

Lead Attach

Die Attach, Wire Bond and Encapsulation

Singulation

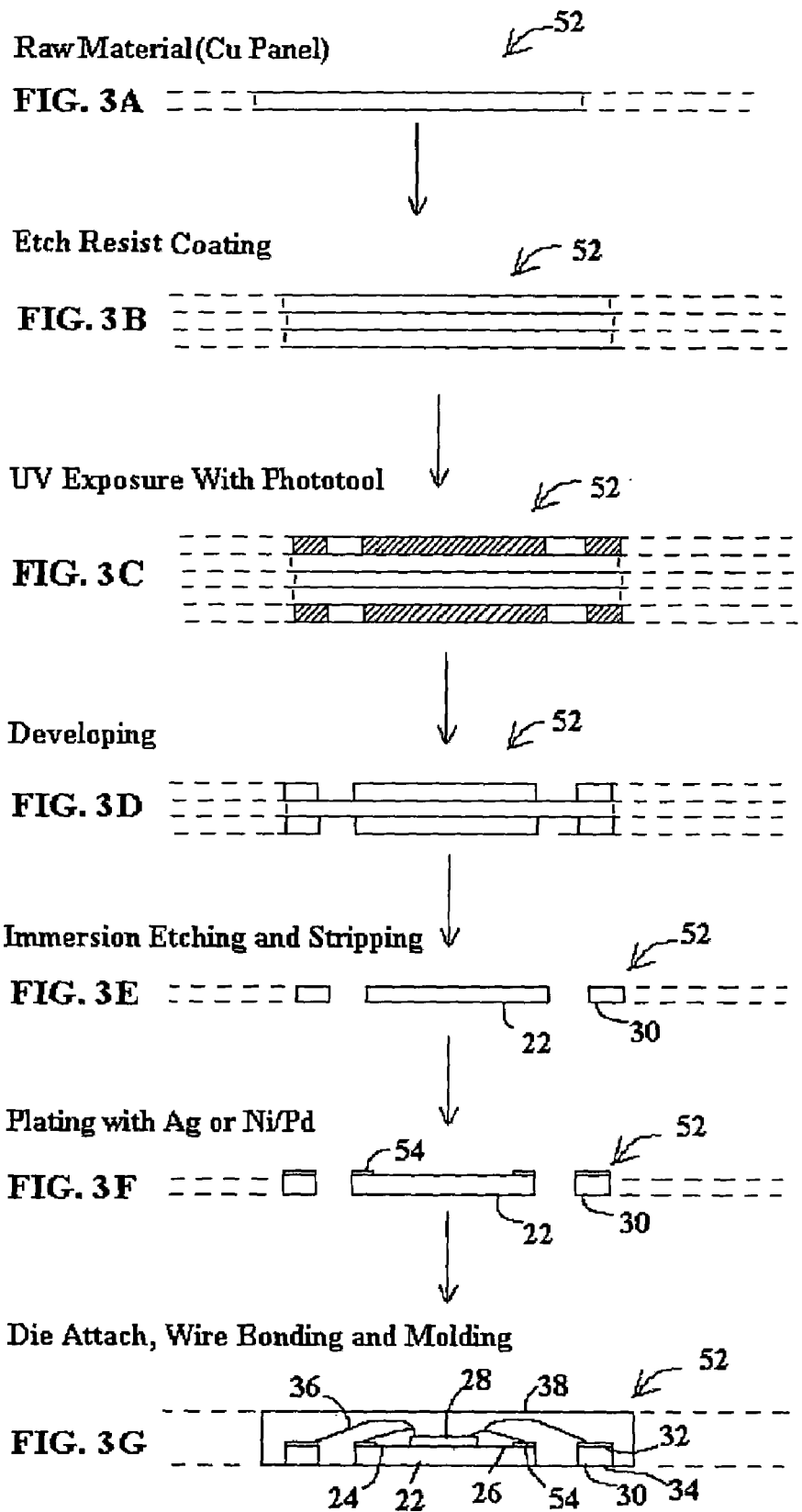

Copper Strips

↓

Solder Plating

↓

Fluxing

↓

Solder Plating

↓

Lamination

↓

Lead Attach

Die Attach, Wire Bond and Encapsulation

Singulation

SHIELDED INTEGRATED CIRCUIT PACKAGE

FIELD OF THE INVENTION

The present invention relates in general to integrated circuit packaging, and more particularly to an integrated circuit package with unique radio frequency and electromagnetic interference shielding.

BACKGROUND OF THE INVENTION

According to well known prior art IC (integrated circuit) packaging methodologies, semiconductor dice are singulated and mounted using epoxy or other conventional means onto respective die attach pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a motherboard.

Conventional molding materials are plastic and serve to encapsulate, protect and provide support for the semiconductor dice and wire bonds. While such structures have achieved considerable use, these packages fail to provide shielding which is desirable for certain applications, such as radio frequency (RF) applications. The plastic molding materials are substantially transparent to radio frequency electromagnetic radiation and consequently radio frequency interference signals or electromagnetic interference signals are permitted to enter and escape from the IC package.

With increasing performance and package density demands, the interference signals emitted from IC packages is also increasing. These signals are undesirable as they may interfere with other components or may exceed federally regulated levels.

IC package shield systems and packages including shields have found use in these applications, in order to inhibit the interference signals from entering or exiting the IC package. Conventional shields include a metallic cap which is adhered to a top surface of the IC package. While the incorporation of such a cap is generally effective in shielding the IC package, there is an associated increase in the size of the package, thereby decreasing package density.

It is therefore desirable to provide a shielded integrated circuit package that obviates or mitigates at least some of the disadvantages of the prior art.

SUMMARY OF THE INVENTION

In one aspect of the present invention, there is provided a shielded integrated circuit package. The package includes a die attach pad having a first side and a second side. A first semiconductor die is mounted to the first side of the die attach pad, a plurality of contact pads disposed in close proximity to the first semiconductor die. A first plurality of wire bonds connect the first semiconductor die and ones of the contact pads. An overmold encapsulates the first plurality of wire bonds and the first semiconductor die, the die attach pad and the contact pads being embedded in the overmold. A plurality of leads are disposed proximal the second side of the die attach pad. A second semiconductor die is mounted to one of the second side of the die attach pad and ones of the plurality of leads such that the ones of the plurality of leads are electrically connected to the second semiconductor die. The second semiconductor die and the leads are embedded in an encapsulant. The die attach pad shields the second semiconductor die.

In another aspect of the present invention, there is provided a process for fabricating a shielded integrated circuit package. The process includes providing a strip having at least one leadless plastic chip carrier comprising a die attach pad having a first side and a second side, a first semiconductor die mounted to the first side of the die attach pad, a plurality of contact pads disposed in close proximity to the first semiconductor die, a first plurality of wire bonds connecting the first semiconductor die and ones of the contact pads, and an overmold encapsulating the first plurality of wire bonds and the first semiconductor die, the die attach pad and the contact pads being embedded in the overmold. A plurality of leads are mounted on the leadless plastic chip carrier package, proximal the second side of the die attach pad. A second semiconductor die is mounted on one of the second side of the die attach pad and ones of the leads and electrically connect the second semiconductor die to the ones of the leads. The second semiconductor die is shielded by the die attach pad. The second semiconductor die and the plurality of leads are embedded in an encapsulant and the shielded integrated circuit package is singulated from the strip.

Advantageously, the die attach pad provides shields radio frequency interference signals or electromagnetic interference signals to or from the second semiconductor die. Also, a multiple chip package is provided. In one aspect, the first semiconductor die is a CMOS chip and the second semiconductor die is an RF chip, thereby providing a package for use in a wireless transceiver.

BRIEF DESCRIPTION OF THE DRAWINGS

The invention will be better understood with reference to the following description and to the drawings, in which.

DETAILED DESCRIPTION OF THE PREFERRED EMBODIMENTS

Figure 1:
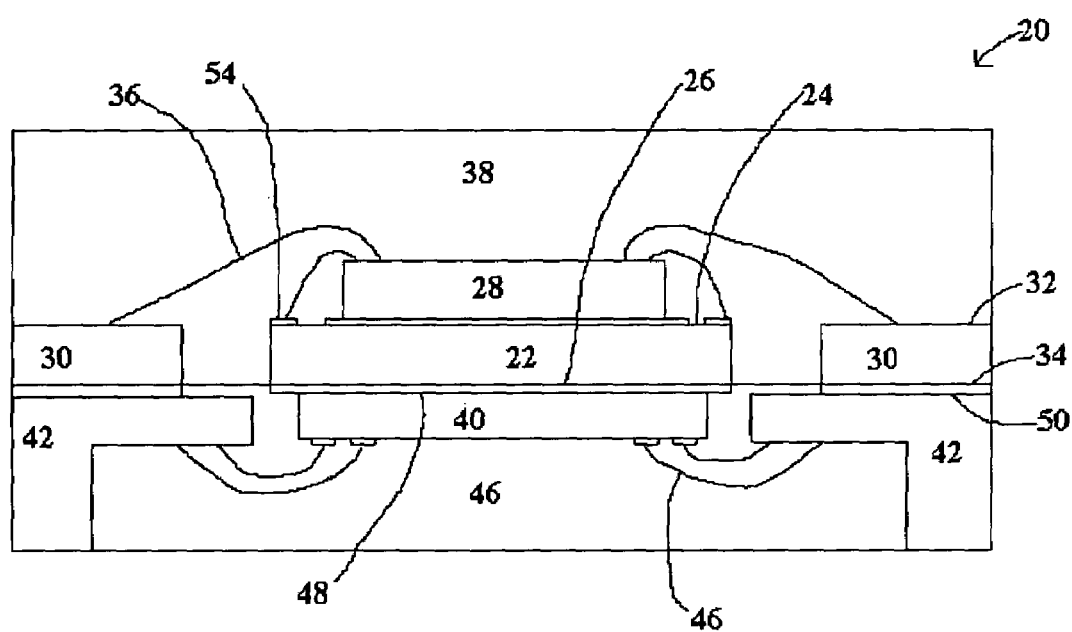
FIG. 1 shows a sectional side view of a shielded integrated circuit package according to an embodiment of the present invention.

Reference is first made to FIG. 1, a sectional side view of a shielded integrated circuit package indicated generally by the numeral 20. The package 20 includes a die attach pad 22 having a first side 24 and a second side 26. A first semiconductor die 28 is mounted to the first side 24 of the die attach pad 22. A plurality of contact pads 30 are disposed in close proximity to the first semiconductor die 28 and each contact pad 30 has a first side 32 and a second side 34. A first plurality of wire bonds 36 connect the first semiconductor die 28 and ones of the contact pads 30. An overmold 38 encapsulates the first plurality of wire bonds 36 and the first semiconductor die 28. The die attach pad 22 and the contact pads 30 are embedded in the overmold 38 such that the first side 24 of the die attach pad 22 and the first side 32 of each of the contact pads 30 are encapsulated in the overmold 38. A second semiconductor die 40 is mounted to the second side 26 of the die attach pad 22 and a plurality of leads 42 are disposed in close proximity to the second semiconductor die 40. A second plurality of wire bonds 44 connect the second semiconductor die 40 and ones of the leads 42 and an encapsulant 46 encapsulates the second plurality of wire bonds 44. The second semiconductor die 40 and the leads 42 are embedded in the encapsulant 46 such that a first side 48 of the second semiconductor die 40 and a first side 50 of each of the leads 42 are encapsulated in the encapsulant 46.

Figure 2H:
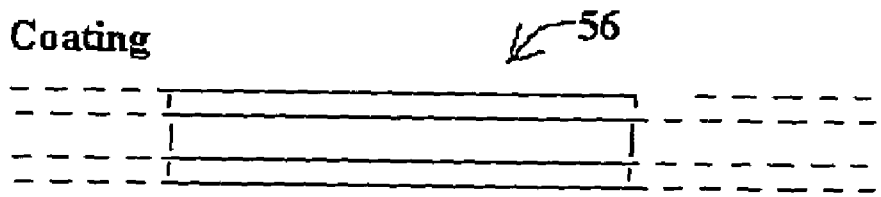
FIGS. 2A to 2O show processing steps for manufacturing the shielded integrated circuit package of FIG. 1, according an embodiment of the present invention.
Figure 2I:
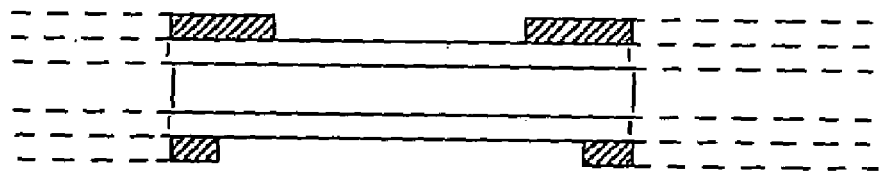
Figure 2J:
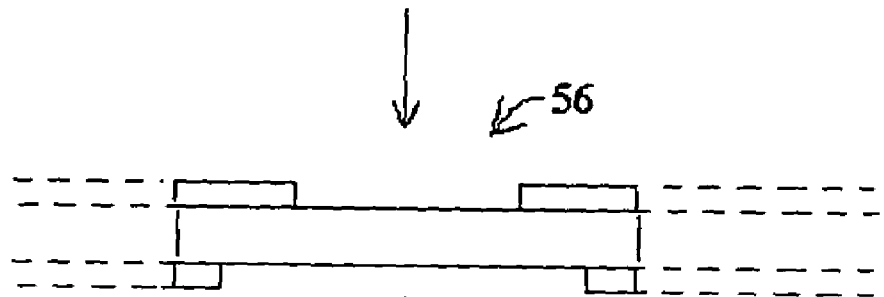
Figure 2K:
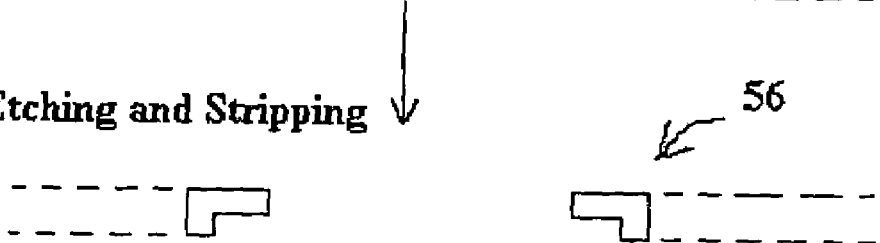
Figure 2L:
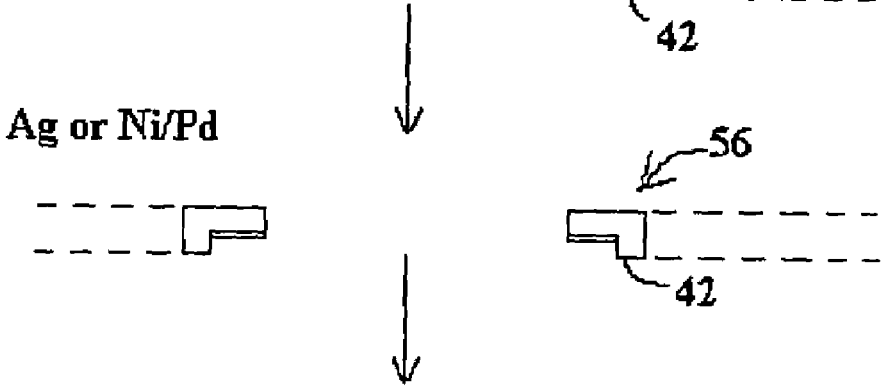
Figure 2M:
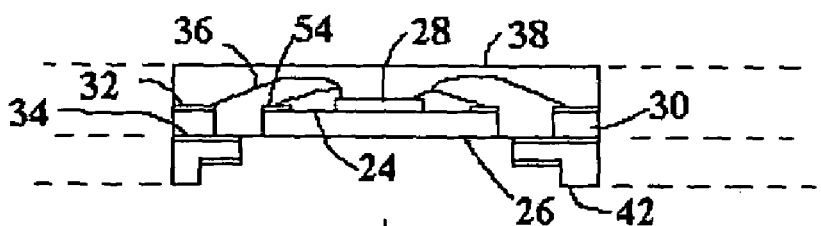
Figure 2N:
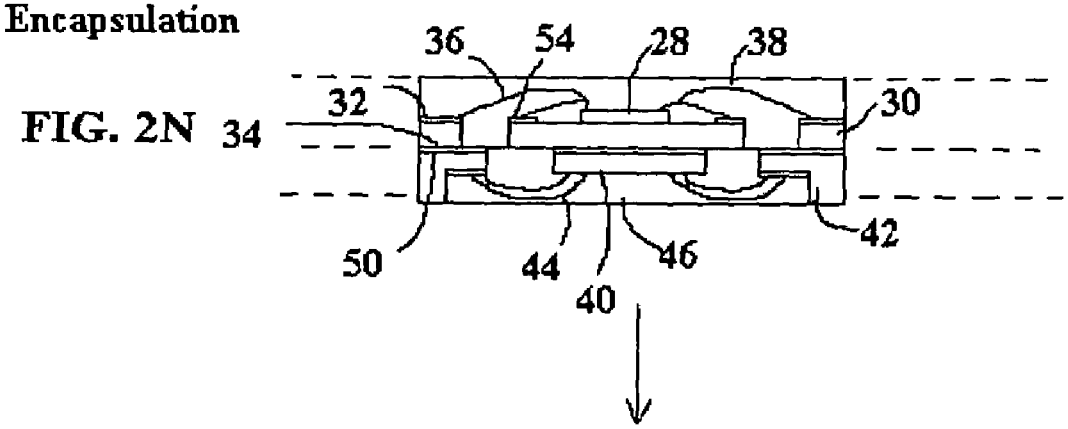
Figure 2O:
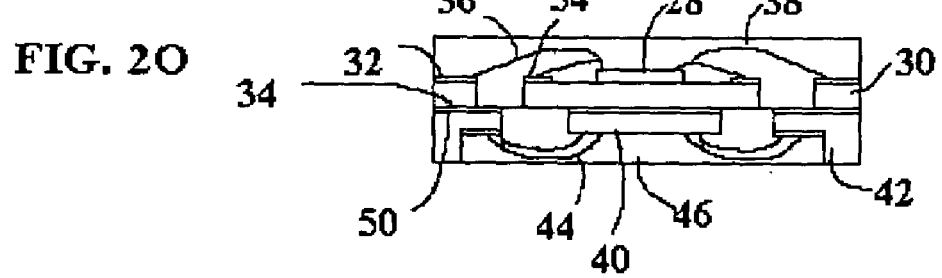

Reference is now made to FIGS. 2A to 2O to describe the processing steps for manufacturing a shielded integrated circuit package, according to an embodiment of the present invention. Referring to FIG. 2A, there is provided an elevation view of a copper (Cu) panel substrate which forms the raw material of the leadframe indicated generally by the numeral 52. As discussed in greater detail in Applicant's own U.S. Pat. No. 6,229,200, the entire contents of which are incorporated herein by reference, the leadframe strip 52 is divided into a plurality of sections, each of which incorporates a plurality of leadframe units in an array (e.g. 5×5 array). Only one such unit is depicted in the elevation view of FIG. 2A, portions of adjacent units being shown by stippled lines.

Referring to FIG. 2B, an upper and a lower surface of the leadframe strip 52 is coated with a layer of photo-imageable etch resist such as a photo-imageable epoxy. The photo resist is spin coated on the leadframe strip.

Next, the layer of photo-imageable etch resist is imaged with a photo-tool. This is accomplished by exposure of the etch resist to ultraviolet light masked by the photo-tool, as shown in FIG. 2C, and subsequent developing of the etch resist, as shown in FIG. 2D. The etch resist is thereby patterned to provide pits on both the upper and the lower surfaces of the leadframe strip, in which the Cu substrate is exposed.

The leadframe strip 52 is then immersion etched in order to etch both the top and bottom surfaces and, following which, the etch resist is stripped away using conventional means. The resulting pattern of die attach pad 22 and contact pads 30 is shown in FIG. 2E. As shown, the die attach pad 22 has first side 24 and second side 26. Similarly, each contact pad 30 has first side 32 and second side 34.

Next, the leadframe strip 52 is selectively plated with silver (Ag) or nickel and palladium (Ni/Pd) or nickel and gold (Ni/Au) to facilitate wire bonding (FIG. 2F). The plating covers a peripheral portion of the first side 24 of the die attach pad 22 and the first side 32 of each of the contact pads 30. It will be appreciated that the peripheral portion of the die attach pad 22 is plated to form a ground ring 54 for ground bond application.

A singulated semiconductor die 28 is conventionally mounted via epoxy (or other means) on the first side 24 of the die attach pad 22, and the epoxy is cured. Gold wires 36 are then bonded between the semiconductor die 28 and peripheral contact pads 30 and between the semiconductor die 28 and the ground ring 54. The leadframe 52 is then molded using a modified mold with the bottom cavity being a flat plate, and subsequently cured, as discussed in Applicants' U.S. Pat. No. 6,229,200, the contents of which are incorporated herein by reference. The leadframe 52, after the foregoing steps, is shown in FIG. 2G, which includes overmold 38 of cured plastic or epoxy. Clearly the second side 34 of the contact pads 30 and the second side 26 of the die attach pad 22 are exposed.

It will be appreciated that thus far, a process for manufacturing a leadless plastic chip carrier (LPCC) has been described herein.

Referring to FIG. 2H, an upper and a lower surface of a second leadframe strip 56 is coated with a layer of photo-imageable etch resist such as a photo-imageable epoxy. The photo-imageable etch resist is spin coated on the second leadframe strip 56.

Next, the layer of photo-imageable etch resist is imaged with a photo-tool. This is accomplished by exposure of the photo-imageable etch resist to ultraviolet light masked by the photo-tool, as shown in FIG. 2I, and subsequent developing of the etch resist, as shown in FIG. 2J. The photo-imageable etch resist is thereby patterned to provide pits on both the upper and the lower surfaces of the second leadframe strip 56, in which the copper substrate is exposed.

The second leadframe strip 56 is then immersion etched in order to etch both the top and bottom surfaces and the photo-imageable etch resist is then stripped away using conventional means. The resulting pattern of leads 42 is shown in FIG. 2K.

Next, the leads 42 are selectively plated with silver (Ag) or nickel and palladium (Ni/Pd) or nickel and gold (Ni/Au) to facilitate wire bonding (FIG. 2L).

The strip of leads 42 is then attached to the leadframe strip 52 using a conductive adhesive, or other suitable conductive attachment means. As shown in FIG. 2M, the second side 34 of the contact pads 30 are in electrical contact with a side 50 of the leads 42 as the leads 42 are attached to the contact pads 30 by conductive material.

Next, a second singulated semiconductor die 40 is conventionally mounted via epoxy (or other means) on the second (exposed) side 26 of the die attach pad 22, and the epoxy is cured. Gold wires 44 are then bonded between the second semiconductor die 40 and the leads 42. A glob-top material is then added to encapsulate the wires 44 between the second semiconductor die 40 and the leads 42. As shown in FIG. 2N, the glob-top material surrounds the second semiconductor die 40 and the leads 42 such that the second semiconductor die 40 and the leads 42 are embedded in the glob-top.

Singulation of the individual units from the full leadframe array 52 is then performed either by saw singulation or die punching resulting in the final configuration of FIG. 2O. Thus, the individual package 20 is isolated.

In a preferred embodiment, the first semiconductor die 28 is a complementary metal oxide semiconductor (CMOS) analog chip and the second semiconductor die is a radio frequency (RF) chip which is effectively shielded by the die attach pad 22.

Figure 3H:
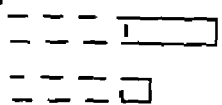
FIGS. 3A to 3O show processing steps for manufacturing the shielded integrated circuit package of FIG. 1, according to an alternative embodiment of the present invention.
Figure 3H:
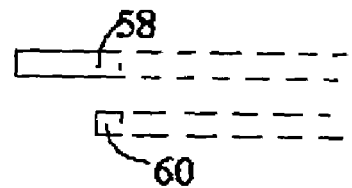
Figure 3I:
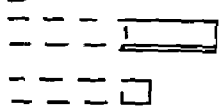
Figure 3I:
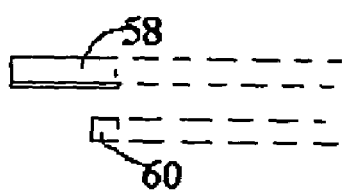
Figure 3J:
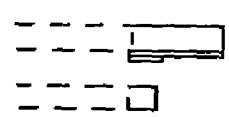
Figure 3J:
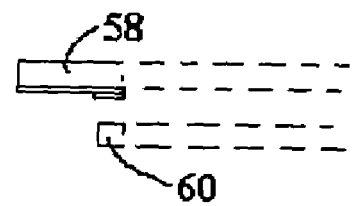
Figure 3K:
Figure 3K:
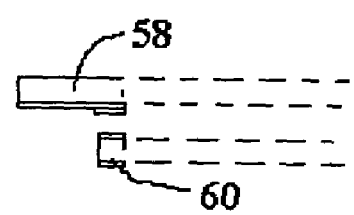
Figure 3L:
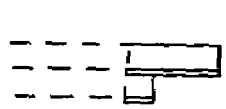
Figure 3L:
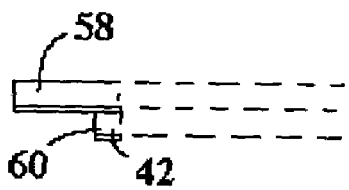
Figure 3M:
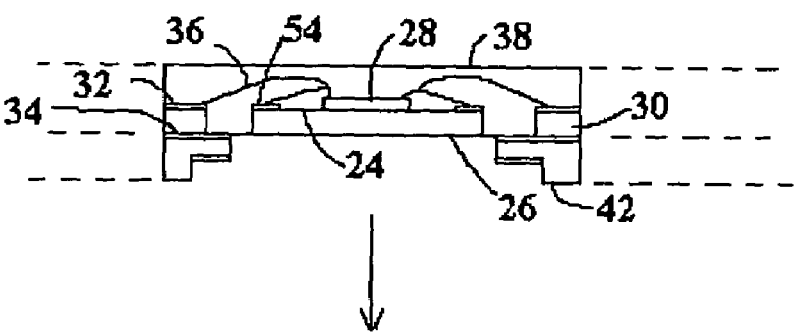
Figure 3N:
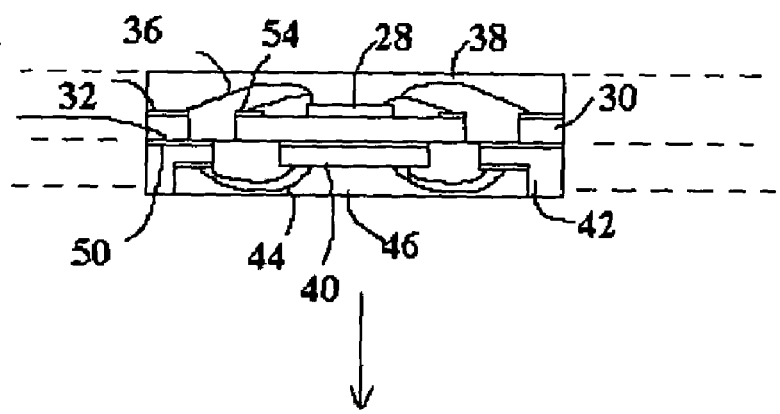
Figure 3O:
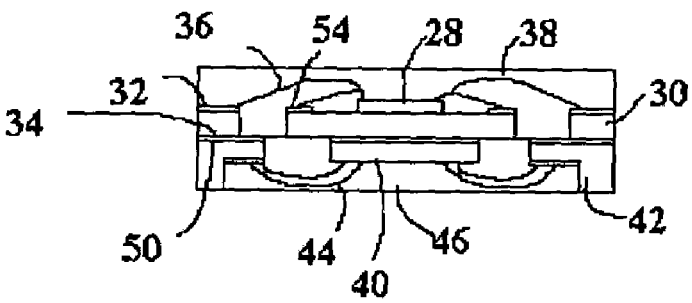

Reference is now made to FIGS. 3A top 3O which show the processing steps for manufacturing a shielded integrated circuit package according to another embodiment of the present invention. FIGS. 3A to 3G of the present embodiment are similar to FIGS. 2A to 2G of the above-described embodiment and will not be further described herein.

FIG. 3H shows a pair of copper strips 58, 60, which form a second leadframe strip. The first copper strip 58 is coated on a first surface thereof, with solder plating (FIG. 3I). The coating is added to enhance lamination and provide a surface for soldering and solder flux is then added to a portion of the first copper strip 58 (FIG. 3J). The second copper strip 60 is plated with solder plating on both the top and bottom surface (FIG. 3K). The second copper strip 60 is then laminated to the first copper strip 58 using a proximity placement and thermal solder reflow technique to form the strip of leads 42 (FIG. 3L). In an alternative embodiment, the second copper strip 60 is laminated to the first copper strip 58 by a hot roller thermo-compressive cladding process.

The strip of leads 42 is then attached to the leadframe strip 52 using a conductive adhesive, or other suitable conductive attachment means. As shown in FIG. 3M, the second side 34 of the contact pads 30 are in electrical contact with the side 50 of the leads 42 as the leads 42 are attached to the contact pads 30 by conductive material. It will be apparent that FIG. 3M is similar to FIG. 2M, except that the strip of leads 42 are formed of a pair of laminated copper strips, rather than formed by an etch process.

FIGS. 3N and 3O are similar to FIGS. 2N and 2O, respectively, and are not further described herein.

Figure 4A:
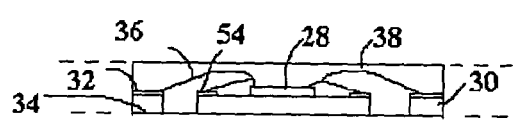
FIGS. 4A to 4D show processing steps for manufacturing the shielded integrated circuit package of FIG. 1, according to another embodiment of the present invention.
Figure 4B:
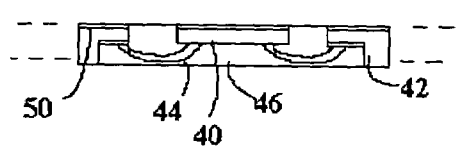
Figure 4C:
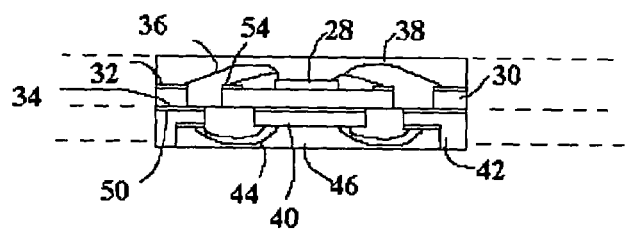
Figure 4D:
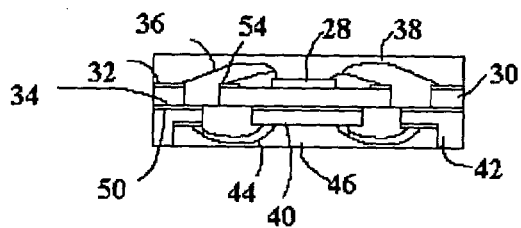

In an alternative embodiment, a strip of LPCC packages is assembled, as described above and shown in FIG. 4A and a strip of exposed die packages is assembled as shown in FIG. 4B. After full assembly of each strip, the strips are aligned and joined by solder reflow technique (FIG. 4C). Next, the individual units are saw singulated (FIG. 4D).

Figure 5:
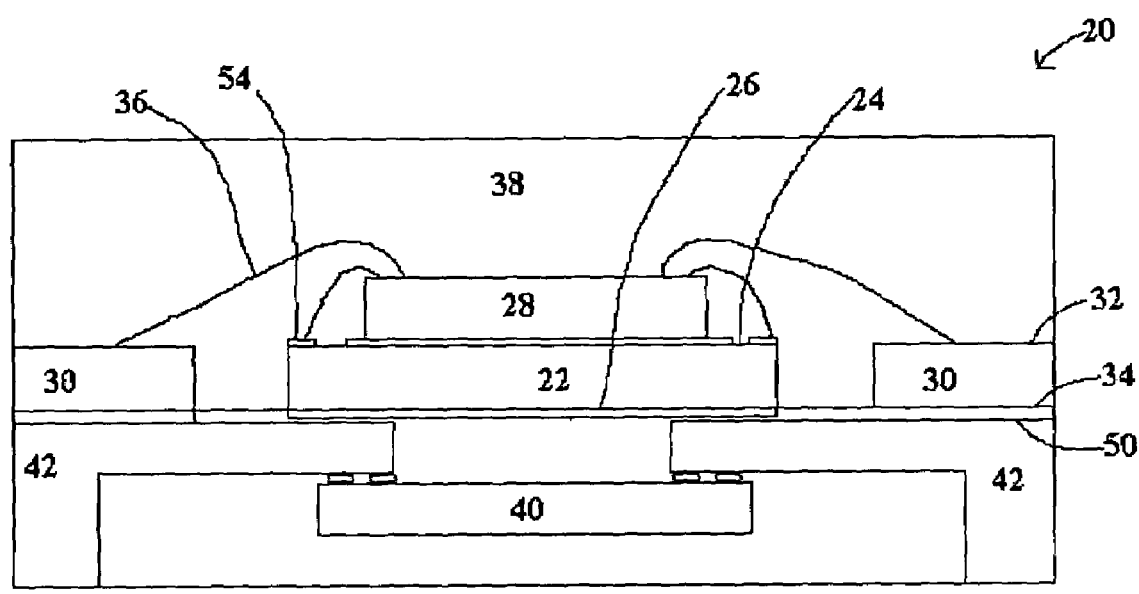
FIG. 5 is a sectional side view of a shielded integrated circuit package according to yet another embodiment of the present invention.

FIG. 5 is a sectional side view of a shielded integrated circuit package according to yet another embodiment of the present invention. In the embodiment of FIG. 5, the leads 42 and the second semiconductor die 40 are arranged in a flip-chip manner. The semiconductor die 40 is attached to the leads 42, rather than the second side of the die attach pad 22 such that pads of the semiconductor die 40 are electrically connected to the leads 42. Thus, wire bonds between the semiconductor die 40 and the 42 are not required in the present embodiment.

Alternative embodiments and variations are possible. For example, the leadframe strip is not limited to copper as other leadframe strip materials will occur to those skilled in the art. Also, other LPCC manufacturing processes are possible. Rather than building a second package on the LPCC package, the second package can be pre-manufactured and the entire package is then mounted to the LPCC package. Also, additional semiconductor dice can be added to provide multi-chip packages. Still other embodiments and variations may occur to those of skill in the art. All such embodiments and variations are believed to be within the scope and sphere of the present invention.

What is claimed is:

1. A shielded integrated circuit package comprising:
   a die attach pad having a first side and a second side;
   a first semiconductor die directly mounted to said first side of said die attach pad;
   a plurality of contact pads disposed in close proximity to said first semiconductor die;
   a first plurality of wire bonds connecting said first semiconductor die and ones of said plurality of contact pads;
   an overmold encapsulating said first plurality of wire bonds and said first semiconductor die, said die attach pad and said plurality of contact pads being embedded in said overmold;
   a plurality of leads disposed proximal said second side of said die attach pad, said plurality of leads being fixed to and electrically connected to said plurality of contact pads by one of an electrically conductive adhesive and a solder;
   a second semiconductor die mounted to one of said second side of said die attach pad and said plurality of leads, such that ones of said plurality of leads are also electrically connected to said second semiconductor die;
   an encapsulant in which said second semiconductor die and said plurality of leads are embedded,
   wherein said die attach pad shields radio frequency and electromagnetic interference signals from being transmitted to or from said second semiconductor die.

2. The shielded integrated circuit package according to claim 1, wherein said second semiconductor die is directly mounted to said second side of said die attach pad and a second plurality of wire bonds connect said second semiconductor die and said ones of said leads.

3. The shielded integrated circuit package according to claim 1, wherein said second semiconductor die is flip-chip mounted to said ones of said leads, thereby electrically connecting said ones of said leads to said second semiconductor die.

4. The shielded integrated circuit package according to claim 1, wherein sides of ones of said plurality of leads are in electrical contact with sides of ones of said contact pads.

5. The shielded integrated circuit package according to claim 1, wherein said encapsulant is a glob-top material.

6. The shielded integrated circuit package according to claim 1, wherein said second semiconductor die is a radio frequency chip.

7. The shielded integrated circuit package according to claim 6, wherein said first semiconductor die is a complementary metal oxide semiconductor chip.

* * * * *